United States Patent
Massonat et al.

(10) Patent No.: US 10,007,741 B2
(45) Date of Patent: Jun. 26, 2018

(54) METHOD FOR SIMULATING THE GEOLOGICAL FORMATION OF A RIVER ZONE

(75) Inventors: Gérard Massonat, Pau (FR); Francis Morandini, Pau (FR)

(73) Assignee: TOTAL SA, Courbevoie (FR)

(*) Notice: Subject to any disclaimer, the term of this patent is extended or adjusted under 35 U.S.C. 154(b) by 362 days.

(21) Appl. No.: 13/991,360

(22) PCT Filed: Nov. 25, 2011

(86) PCT No.: PCT/FR2011/052769
§ 371 (c)(1),
(2), (4) Date: Jun. 3, 2013

(87) PCT Pub. No.: WO2012/072923
PCT Pub. Date: Jun. 7, 2012

(65) Prior Publication Data
US 2013/0262063 A1 Oct. 3, 2013

(30) Foreign Application Priority Data
Dec. 3, 2010 (FR) ...................... 10 60053

(51) Int. Cl.
G06F 17/50 (2006.01)
G09B 23/40 (2006.01)
G01V 99/00 (2009.01)

(52) U.S. Cl.
CPC .......... G06F 17/5009 (2013.01); G01V 99/00 (2013.01); G09B 23/40 (2013.01)

(58) Field of Classification Search
CPC ...... G06F 17/5009; G01V 99/00; G09B 23/40
USPC .................................................. 703/6, 9, 10
See application file for complete search history.

(56) References Cited

U.S. PATENT DOCUMENTS

| | | | |
|---|---|---|---|
| 6,480,790 B1* | 11/2002 | Calvert et al. | 702/14 |
| 7,561,992 B2* | 7/2009 | Leflon et al. | 703/2 |
| 2004/0267454 A1* | 12/2004 | Granjeon | 702/2 |
| 2006/0173622 A1* | 8/2006 | Deffenbaugh | G01V 1/282 702/2 |
| 2009/0248374 A1* | 10/2009 | Huang et al. | 703/2 |
| 2013/0246031 A1* | 9/2013 | Wu | G06F 17/5009 703/10 |

OTHER PUBLICATIONS

Birnir et al. (The Scholastic theory of fluvial landsurface, 2004 (72 pages)).*
Zwijsen (Stochastic Modeling of Fluid Particle Dispersion in Turbulent Flows, 2007 (64 pages)).*
(Continued)

*Primary Examiner* — Andre Pierre Louis
(74) *Attorney, Agent, or Firm* — Patterson Thuente Pedersen, P.A.

(57) ABSTRACT

Systems and methods for simulating a geological formation of a fluvial zone by using observation data and a spatial model of the fluvial zone. The displacement of particles in the spatial model is simulated by superimposing a deterministic term defined by the observation data and a stochastic term parameterized by the observation data. By virtue of this method, it is possible to take into account both the fluid flow of the particles in the fluvial zone and introduce a probabilistic perturbation.

12 Claims, 5 Drawing Sheets

(56) References Cited

OTHER PUBLICATIONS

Jaqaman et al. (Robust particle tracking in live cell time-lapse sequences, 2008 (17 pages).*
Ferrero et al. (Simulation of a Diffusion Experiment in Neutral Conditions Over Gentle Topogrpahy, 2001 (5 pages)).*
Gillespie (Stochastic Simulation of Chemical Kinetics, 2006 (23 pages)).*
He et al. (Factors Controlling Surface Water Flow in a Low-gradient Subtropical Wetland, Feb. 2010 (12 pages).*

* cited by examiner

METHOD FOR SIMULATING THE GEOLOGICAL FORMATION OF A RIVER ZONE

PRIORITY CLAIM

The present application is a National Phase entry of PCT Application No. PCT/FR2011/052769, filed Nov. 25, 2011, which claims priority from FR Application No. 1060053, filed Dec. 3, 2010, said applications being hereby incorporated by reference herein in their entirety.

FIELD OF THE INVENTION

The invention pertains to the field of the simulation of geological processes for the study of the subsoil. Of particular interest are the phenomena involved in the formation of fluvial zones.

BACKGROUND OF THE INVENTION

Sands constitute regions of interest for oil prospecting. One consequently seeks to predict their presence and their characteristics.

It is possible in particular to attempt to simulate the geological process of their formation. However, a challenge also resides in the formulation of a model which can, relying on observation data, take into account the specific features of fluvial zones so as to provide a result that can be exploited for prospecting.

SUMMARY OF THE INVENTION

According to one aspect, there is envisaged a method for simulating the geological formation of a fluvial zone comprising:
 observation data for the fluvial zone are provided,
 a spatial model of the fluvial zone comprising at least one upstream region and one downstream region is defined, on the basis of the observation data,
 the displacement of particles in the spatial model is simulated by superimposing:
  a deterministic term defined on the basis of the observation data, and
  a stochastic term parameterized at least by the observation data.

By virtue of these provisions, it is possible to take into account both the fluid flow of the particles in the zone, and to introduce a probabilistic perturbation.

When one speaks of superposition of two terms, it will be understood that the simulated displacement is composed from the sum of the deterministic term and of the stochastic term.

In preferred embodiments of the invention, recourse may optionally be had furthermore to one and/or other of the provisions hereinafter.

The stochastic term can comprise the superposition of a meandriform term and of a random perturbation. So doing, the modeling of the channel is rendered more realistic.

The meandriform term can comprise a superposition of at least one trigonometric function. Such a representation is realistic for a meandriform term, and easily parameterizable.

The observation data can comprise at least one of the following types of data:
 a gradient of flow speed in the zone,
 geometric parameters of the zone,
 data arising from drilling,
 data arising from imaging, especially seismic imaging.

According to certain aspects, it is possible to represent a few physical phenomena specific to channels, when the displacement of particles is simulated:
 it is possible to estimate the probability of the occurrence of a separation of a particle into two independent particles and, in the case of occurrence, to effect such a separation;
 when two independent particles are situated at one and the same location, it is possible to estimate the probability of the occurrence of a joining of the two independent particles into one and, in the case of occurrence, such a joining is effected;
 it is possible to estimate the probability of the occurrence of a disappearance of a particle and, in the case of occurrence, to effect such a disappearance.

For example, the probability of occurrence of such events can be estimated as a function of the observation data.

As a variant, when the displacement of particles is simulated, it is possible to also superimpose a displacement field imposed by an exterior source. It is thus possible to take into account exterior sources such as, for example, a littoral drift.

According to one embodiment, it is possible to define a plurality of zones of the spatial model between the upstream region and the downstream region, and to make a parameterization of the stochastic term (in particular, the trigonometric function) in a first zone differ from a parameterization of the stochastic term in at least one second zone. It is thus possible to take into account the fact that a fluvial zone may exhibit very different diverse regions.

For example, when a spatial model is defined, it is possible to define a fairway defining a width and a thickness in which the particles are permitted to move.

According to another aspect, a method is envisaged for fabricating a hydrocarbon extraction facility comprising the implementation of such a simulation method.

According to another aspect, a computer program product is envisaged for simulating the geological formation of a fluvial zone, intended to be stored in a memory of a central unit and/or stored on a memory medium intended to cooperate with a reader of said central unit and/or downloaded via a telecommunication network, characterized in that it comprises instructions for implementing such a method when it is executed on a programmable machine.

Other characteristics and advantages of the invention will be apparent in the course of the following description of one of its embodiments, given by way of nonlimiting example, with regard to the attached drawings.

DESCRIPTION OF PREFERRED EMBODIMENTS

In the various figures, the same references designate identical or similar elements.

Figure 1:
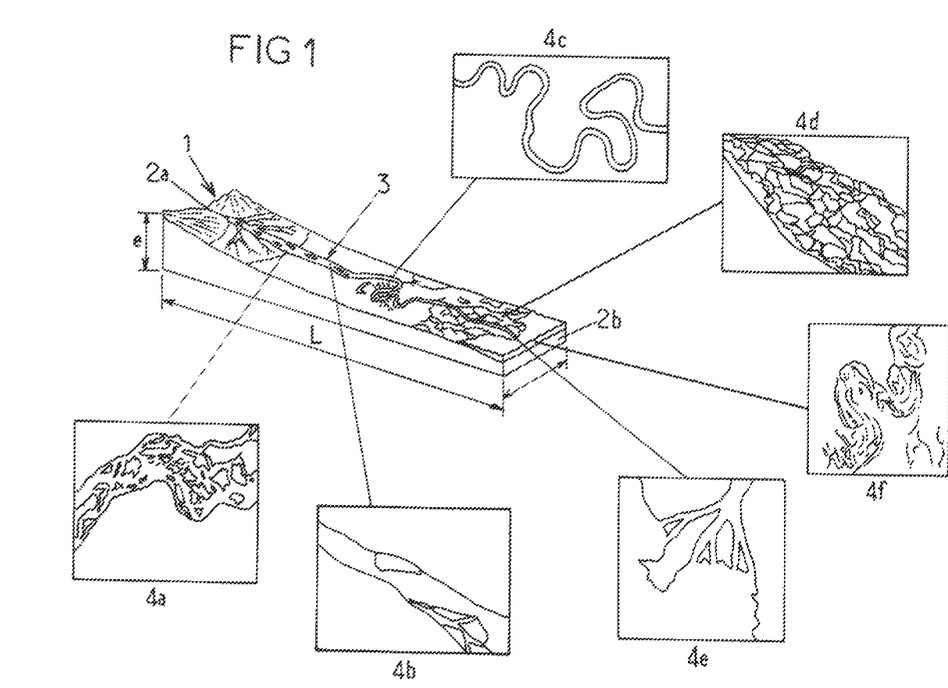
FIG. 1 is a schematic view of a channel.

FIG. 1 describes schematically a fluvial zone 1 extending between an upstream zone 2a and a downstream zone 2b. The fluvial zone to be modeled is considered over a certain width w, a certain thickness e and a certain length L. Thickness and width are for example variable along this length.

A fluvial zone 1 generally comprises a channel 3 extending between the upstream zone and the downstream zone. This channel has been formed by the flow of particles in the course of time from the upstream zone to the downstream zone.

By observation, it is known that a channel can exhibit at least one of the following configurations, the latter being listed here in the order in which they are generally found between the upstream zone and the downstream zone:
- an intertwined system 4a, in which numerous small individual channelways cross and separate while being interspersed with large expanses of earth,
- a system with weak sinuosity 4b, where the channelway extends substantially rectilinear,
- a system with meanders 4c, in which the channelways exhibit a strong sinuosity,
- a system with anastomosis 4d, exhibiting numerous connections between channelways,
- a deltaic system 4e, in which a main channelway divides into a number of secondary channelways emerging into the sea, and
- a turbid system 4f related to the interaction with another flow, such as a maritime flow.

As may be seen, in particular in FIG. 1, these various systems exhibit very different geometric characteristics, and hence the geological properties of the channel in these various zones may be very diverse.

One seeks in particular to model the geological formation of a fluvial zone such as that represented in FIG. 1.

Accordingly, a spatial model of the fluvial zone is defined. Such a spatial model can be produced in the form of a surface mesh or volume mesh in which each of the elements represents a location of the fluvial zone.

Observation data is also available for the fluvial zone whose geological formation it is desired to model. These observation data may for example comprise:
- the definition of the location of an upstream region and of a downstream region defined on the basis of the current geometry of the modeled zone,
- a gradient of flow speed in the fluvial zone, which may for example be defined on the basis of a hydraulic gradient in this zone, and/or on the basis of the altitude data for the upstream and downstream regions,
- geometric parameters of the fluvial zone, such as, for example, the current geometry of the surface of the zone, observed discontinuities, etc.,
- geological data arising from drillings carried out in the zone,
- geological data arising from imaging, for example from seismic imaging carried out in the zone,
- etc.

Figure 2A:
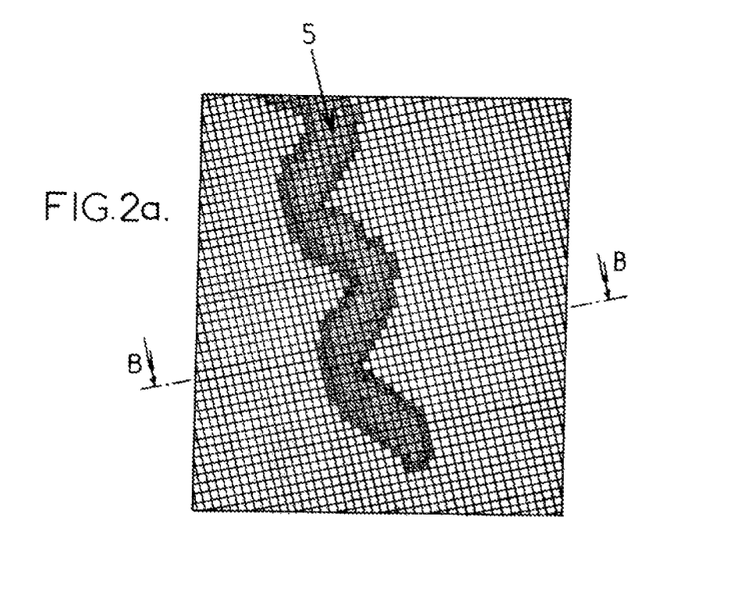
FIG. 2a is a schematic view from above of a channel model.
Figure 2B:
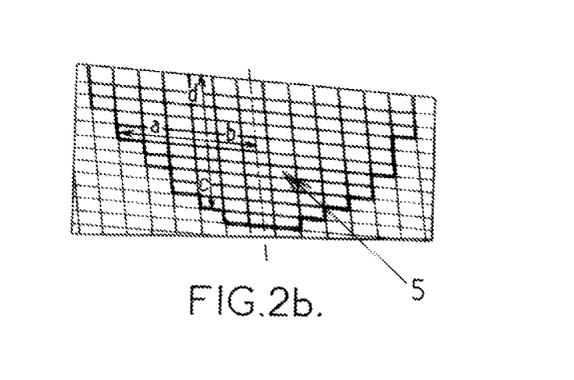
FIG. 2b is a schematic sectional view of a channel.

FIG. 2a thus represents from above a spatial model of a region of the fluvial zone, exhibiting a set of mesh elements, for example parallelepipedal (squares when viewed from above), in which a channel model 5 has already been generated by simulation. FIG. 2b represents a sectional view on the line B-B of FIG. 2a thus representing a slice of the computed channel model 5.

Figure 3:
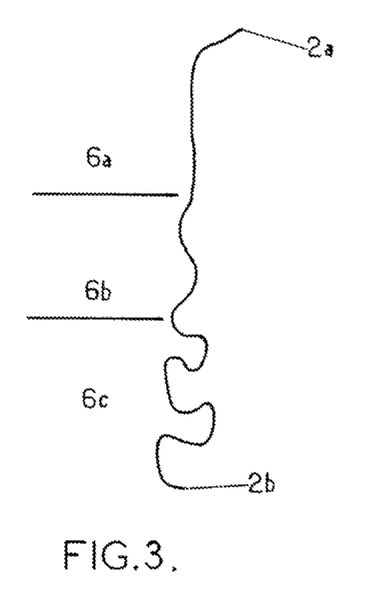
FIG. 3 is an illustrative diagram of the zoning in a channel.

As is represented in FIG. 3, starting from the observation data, it is possible to represent a trajectory of the channel corresponding to the mean direction of flow, extending from the upstream zone 2a to the downstream zone 2b. In the simplified example represented in FIG. 3, this channel exhibits three of the distinct zones mentioned hereinabove in relation to FIG. 1, which are identified in FIG. 3 by the references 6a, 6b and 6c. Each of these zones can form the subject of a separate modeling, while complying with connectedness constraints at the interface between two zones. The modeling of one of these zones will be described hereinafter by reference to FIG. 4.

Figure 4:
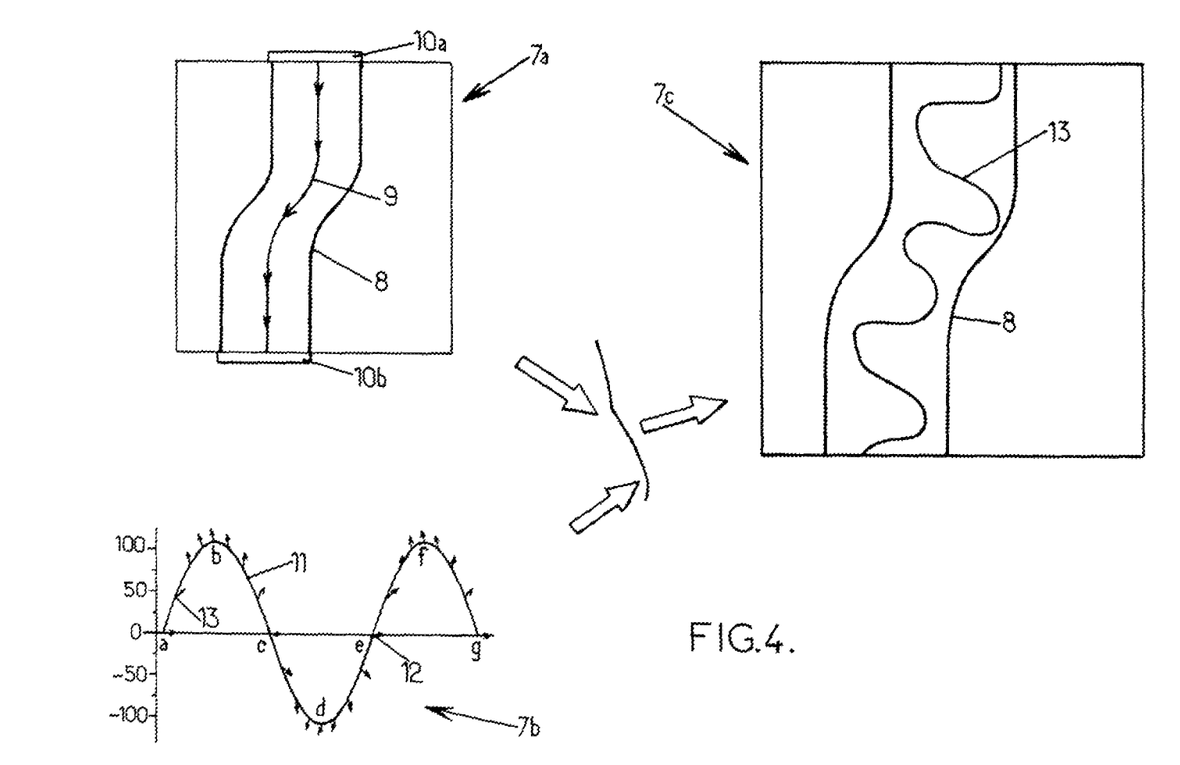
FIG. 4 is an overall diagram illustrating the modeling of particle trajectories in a channel part.

It will be presupposed for example that we are dealing here with zone 6a. As is visible in the window 7a of FIG. 4, a fairway 8 is defined which surrounds the mean flow curve 9 in this zone. The fairway 8 defines a width in which the particles are permitted to flow, this width optionally varying along the mean flow curve (the width is represented constant here). Moreover, the fairway may extend not only over the surface, but also over a certain depth below the plane of representation of the window 7a. The zone represented comprises an upstream hydraulic head 10a and a downstream hydraulic head 10b. The displacement of the particles in the spatial model is simulated by superimposing a deterministic term and a stochastic term. For example, we write:

$$\Delta X = \Delta D + \Delta \Psi,$$

where:
$\Delta X$ represents the displacement of the particle,
$\Delta D$ represents the deterministic term, and
$\Delta \Psi$ represents the stochastic term.

The deterministic term is defined on the basis of the flow field represented in the window 7a of FIG. 4.

The stochastic term is added to this term so as to define a perturbation of the deterministic term. In particular, the stochastic term can itself be produced as the superposition of two terms. The first of these terms is a meandriform term which can easily be produced, from the mathematical point of view, by one or more trigonometric (sinusoidal) terms as represented in the window 7b of FIG. 4. In this window, one and a half periods of a sine have been represented by the curve 11, extending between the points a and g and of a given amplitude. The points a and g correspond to the upstream and downstream zones of the modeled zone, and the number of periods as well as the amplitude of the sine can be independently parameterized for this zone.

A random perturbation, represented in the window 7b of FIG. 4 by the arrows 12, is superimposed on the meandriform term. This random term is defined as a perturbation of the sinusoidal curve 11. The orientation and/or the amplitude of the perturbation can be determined in a random manner on a plurality of points 13 of the sinusoidal curve 11, for example mutually equidistant, or of equidistant abscissa, as represented.

The window 7c of FIG. 4 represents a simulated trajectory 13 of particles, within the fairway 8, obtained on the basis of a superposition of the type mentioned hereinabove. Provision may in particular be made for the parameterization (period, amplitude) of the sinusoidal function to be determined as a function of the zone modeled for the fluvial zone. The parameterization (frequency, intensity) of the random perturbation can be determined as a function of the zone considered. This parameterization can also be performed by taking into account other observation data, from among the observation data mentioned hereinabove.

According to a particular aspect, it is furthermore possible to model certain phenomena arising at the particles in the course of their flow.

Figure 5:
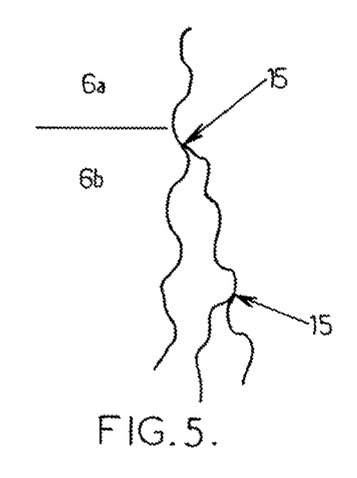
FIG. 5 is an illustrative diagram similar to that of FIG. 3 describing a separation method.

One of these phenomena represented in FIG. 5 is separation or mitosis. In the course of each displacement computation, it is possible to determine a probability that the particle, in the given location, divides.

Such divisions are visible at 15 in FIG. 5. The probability of making allowance for a division may depend on the zone considered. In the example of FIG. 5, provision may for example be made for no division to be possible in zone 6a. In zone 6b, provision may be made for divisions to be possible, and, in the case of division, for a particle to divide into a maximum number of daughter particles (here the maximum number of daughter particles is two). Moreover, it is also possible to parameterize the maximum number of divisions permitted for a particle in a given zone (at the maximum two divisions in zone 6b represented in FIG. 5 in the example represented).

Figure 6:
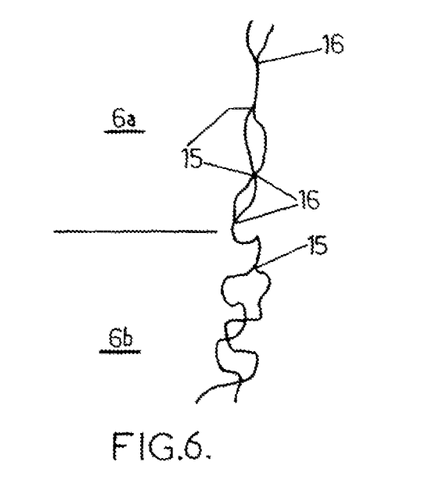
FIG. 6 is a view similar to FIG. 3 describing a fusion method.

Another phenomenon that can be modeled is represented in FIG. 6. This involves, if two particles are situated at a location at one and the same instant, effecting a joining or fusion of these particles. Such a fusion is visible, in FIG. 6, such as represented by the references 16. It will be noted that it will be possible to implement the fusion process in parallel with the division process represented hereinabove, divisions occurring, in the example of FIG. 6, at the point 15.

The possibility of implementing a fusion phenomenon is probabilized. This probability may for example depend on the zone considered. For example, provision may be made for a fusion to be effected systematically in zone 6a. In the zone 6b, such as represented, provision may be made never to implement fusion.

Figure 7:
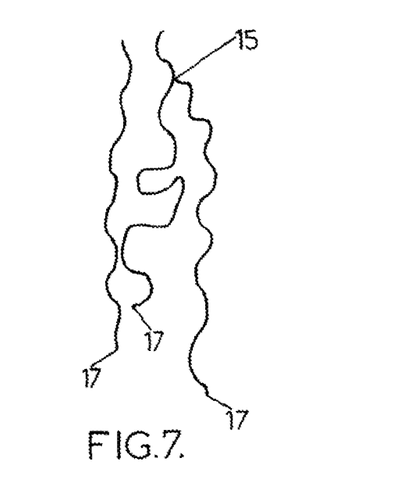
FIG. 7 is a view similar to FIG. 3 describing a disappearance method.

Another phenomenon that may be modeled is represented in FIG. 7. This involves, in this instance, a particle disappearance phenomenon. Provision may for example be made that a particle will disappear after having traveled a certain distance, or it is possible to probabilize the possibility of seeing a disappearance occur as a function of the path traveled by the particle. Such disappearances are visible, referenced by the reference 17 in FIG. 7. Separation, joining and disappearance can be probabilized as a function of observation data.

Figure 8:
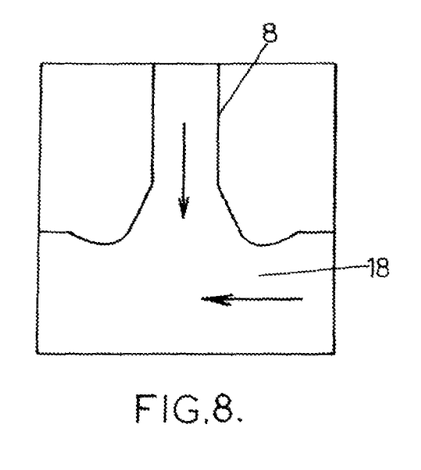
FIG. 8 is a schematic view from above of a model in which a displacement field imposed by an exterior source is symbolized.

Another phenomenon that can be modeled is the superposition of another energy source on the flow in the fluvial zone. By way of example, provision may for example be made for this other energy source to be a littoral drift such as represented by the arrow 18 in FIG. 8. This term may for example be added to the deterministic term directly determined by the hydraulic gradient in the zone during the computation of the displacement of the particles.

When the simulation is effected, the displacement of particles in the fluvial zone is simulated according to one and/or other of the equations and phenomena presented hereinbelow. This simulation is for example implemented on a programmable machine, such as a computer, having stored in memory a computer program stored in memory locally or accessible via a network, and programmed to implement the steps hereinabove. It is possible to implement a criterion for determining the end of simulation, for example based on the number of particles simulated, on the simulation time, and/or on the resemblance of certain results of the simulation to observation data.

The simulation may make it possible to evaluate one and/or other of the following parameters:
 the trajectory of the channel,
 the azimuth of the points of which its trajectory is composed (in particular the orientation with respect to North),
 the radius of curvature of the trajectories,
 their termination,
 for each point of the trajectory, the distance with respect to the bed (bottom) and to the edge of the channel,
 for each mesh cell of the channel, a property indicating a distance with respect to the edge closest, at the center, to the bed or to the roof (surface of the channel),
 the zonation,
 etc.

The realistic modeling of channel formation, obtained hereinabove, and the parameters hereinabove may be useful within the framework of the oil-related exploitation of certain locations of the channel. It is for example possible to predict, over a channel sometimes measuring several hundred kilometers in length, the zones liable to contain hydrocarbon deposits. If a zone is predicted to be of particular interest in respect of such exploitation, provision may be made to install an exploitation facility there and, if appropriate, to produce hydrocarbons on the basis of the results of the simulation method.

The embodiments above are intended to be illustrative and not limiting. Additional embodiments may be within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

The invention claimed is:

1. A method for oil-related exploitation by simulating a geological formation of a fluvial zone comprising:
 providing a gradient of flow speed for the fluvial zone,
 defining a spatial model of the fluvial zone comprising at least one upstream region and one downstream region, on the basis of the gradient of flow speed,
 simulating the displacement of particles in the spatial model by superimposing: a deterministic term defined on the basis of the gradient of flow speed, and a stochastic term parametrized at least by the gradient of flow speed, wherein a plurality of zones of the spatial model is defined between the upstream region and the downstream region, and in which a parametrization of the stochastic term in a first zone differs from a parametrization of the stochastic term in at least one second zone wherein a trajectory of a channel corresponding to mean direction of flow extending from the upstream region to the downstream region is represented;

predicting an area in the fluvial zone more likely to contain a hydrocarbon deposit based on the simulating of the geological formation; and installing a hydrocarbon exploitation facility and producing hydrocarbons in the area more likely to contain the hydrocarbon deposit, based on a result of the simulation.

2. The method as claimed in claim 1, in which the stochastic term comprises the superposition of a meandriform term and of a random perturbation.

3. The method as claimed in claim 2, in which the meandriform term comprises a superposition of at least one trigonometric function.

4. The method as claimed in claim 1, in which, when simulating the displacement of particles further includes:
estimating the probability of the occurrence of a separation of a particle into two independent particles and, in the case of occurrence, a separation is effected.

5. The method as claimed in claim 1, in which, when simulating the displacement of particles, when two independent particles are situated at one and the same location further includes:
estimating the probability of the occurrence of a joining of the two independent particles into one and, in the case of occurrence, a joining is effected.

6. The method as claimed in claim 1, in which, when simulating the displacement of particles further includes:
estimating the probability of the occurrence of a disappearance of a particle and, in the case of occurrence, a disappearance is effected.

7. The method as claimed in claim 4, in which said probability is estimated as a function of the gradient of flow speed.

8. The method as claimed in claim 1, in which, when simulating the displacement of particles, a displacement field imposed by an exterior source is also superimposed.

9. The method as claimed in claim 3, in which the trigonometric function is chosen as a function of the zone.

10. The method as claimed in claim 1, in which the trigonometric function is chosen as a function of the zone.

11. The method as claimed in claim 1, in which, when defining a spatial model, a fairway is defined, defining a width and a thickness in which the particles are permitted to move.

12. A non-transitory computer readable storage medium for simulating the geological formation of a fluvial zone, having stored thereon a computer program comprising program instructions, the computer program being loadable into a data-processing unit and causing the data-processing unit to carry out, when the computer program is run by the data-processing device, the steps of:

receiving provided gradient of flow speed for the fluvial zone, defining a spatial model of the fluvial zone comprising at least one upstream region and one downstream region, on the basis of the gradient of flow speed, simulating the displacement of particles in the spatial model by superimposing: a deterministic term defined on the basis of the gradient of flow speed, and a stochastic term parametrized at least by the gradient of flow speed, wherein a plurality of zones of the spatial model is defined between the upstream region and the downstream region, and in which a parametrization of the stochastic term in a first zone differs from a parametrization of the stochastic term in at least one second zone wherein a trajectory of a channel corresponding to mean direction of flow extending from the upstream region to the downstream region is represented;

predicting an area in the fluvial zone more likely to contain hydrocarbon deposits; and installing a hydrocarbon exploitation facility and exploiting or producing hydrocarbons in the area more likely to contain hydrocarbons, based on a result of the simulation.

* * * * *